United States Patent [19]
Lee et al.

[11] Patent Number: 5,266,521
[45] Date of Patent: Nov. 30, 1993

[54] METHOD FOR FORMING A PLANARIZED COMPOSITE METAL LAYER IN A SEMICONDUCTOR DEVICE

[75] Inventors: Sang-in Lee, Suwon; Chang-soo Park; Jeong-ha Son, both of Seoul, all of Rep. of Korea

[73] Assignee: Samsung Electronics Co., Ltd.

[21] Appl. No.: 828,458

[22] Filed: Jan. 31, 1992

[30] Foreign Application Priority Data

Mar. 20, 1991 [KR] Rep. of Korea ............... 91-4396
Jun. 27, 1991 [KR] Rep. of Korea ............... 91-10766

[51] Int. Cl.⁵ .................................. H01L 21/441
[52] U.S. Cl. ............................. 437/188; 437/189; 437/190; 437/192; 437/194; 437/197; 437/199
[58] Field of Search ............... 437/173, 174, 187, 188, 437/189, 190, 192, 194, 195, 197, 198, 199, 202

[56] References Cited

U.S. PATENT DOCUMENTS

| | | |
|---|---|---|
| 4,650,696 | 3/1987 | Raby .................... 437/200 |
| 4,920,070 | 4/1990 | Mukai ................... 437/173 |
| 4,970,176 | 11/1990 | Tracy et al. ........... 437/187 |

FOREIGN PATENT DOCUMENTS

| | | |
|---|---|---|
| 0089559 | 9/1983 | European Pat. Off. . |
| 0251523 | 1/1988 | European Pat. Off. . |
| 0287096 | 10/1988 | European Pat. Off. . |
| 0316612 | 5/1989 | European Pat. Off. . |
| 0387835 | 9/1990 | European Pat. Off. ........... 437/203 |
| 58-74037 | 5/1983 | Japan . |
| 59-61146 | 4/1984 | Japan . |
| 59-219940 | 12/1984 | Japan . |
| 62-211915 | 9/1987 | Japan . |
| 62-219517 | 9/1987 | Japan . |
| 1-246831 | 10/1989 | Japan . |
| 2-79433 | 3/1990 | Japan .................... 437/200 |
| 2-159065 | 6/1990 | Japan .................... 437/204 |
| 1157581 | 7/1969 | United Kingdom . |
| 2212979 | 8/1989 | United Kingdom . |

OTHER PUBLICATIONS

Wolf, et al., VLSI Processing, Lattice Press, 1986, vol. 1, pp. 331-381.

Pauleau, Y., "Interconnect Materials for VLSI Circuits" Solid State Technology, vol. 30, No. 6 (Jun. 1987), pp. 101-105.

*Primary Examiner*—T. N. Quach

[57] ABSTRACT

A method for manufacturing a semiconductor device, comprising the steps of forming an insulating interlayer on a semiconductor substrate to provide a semiconductor intermediate product, providing the insulating interlayer with an opening, forming a first metal layer on the semiconductor intermediate product, heat-treating the first metal layer to fill up the opening with the metal, forming a second metal layer on the first metal layer, and then heat-treating the second layer to planarize the metal layer. An alternative embodiment of the invention encompasses a method for manufacturing a semiconductor device, comprising the steps of providing a semiconductor wafer with an opening formed thereon, forming a metal layer on the semiconductor wafer, and then heat-treating the metal layer to fill up the opening with the metal, wherein pure Al or an aluminum alloy having no Si component is used as the metal in forming the metal layer.

54 Claims, 5 Drawing Sheets

METHOD FOR FORMING A PLANARIZED COMPOSITE METAL LAYER IN A SEMICONDUCTOR DEVICE

BACKGROUND OF THE INVENTION

The present invention relates to a method for manufacturing a semiconductor device, and more particularly to a method for forming a planarized metal layer in a semiconductor device. The present invention is an improvement over the invention which is the subject matter of the present inventor's copending U.S. patent application Ser. No. 07/585,218 filed on Sep. 19, 1990, the disclosure of which is hereby incorporated into this application by reference.

The metallization process is regarded by some as the most important aspect of semiconductor device manufacturing technology, since it increasingly determines yield, and the performance (e.g. speed of operation), and reliability of the devices, as the technology advances toward ultra large-scale integration (ULSI). Metal step coverage was not a serious problem with less dense prior art semiconductor devices, because of their characteristic features of larger geometries, contact holes having low aspect ratios (the ratio of depth to width), and shallow steps. However, with increased integration density in semiconductor devices, contact holes have become significantly smaller while impurity-doped regions formed in the surface of the semiconductor substrate have become much thinner. Due to the resultant higher aspect ratio of contact holes and larger depths of steps, with these current, greater-density semiconductor devices, it has become necessary, in order to achieve the standard design objectives of high-speed performance, high yield, and good reliability of the semiconductor device, to improve upon the conventional aluminum (Al) metallization process. More particularly, the utilization of the conventional Al metallization process in the fabrication of these current higher-density semiconductor devices, has resulted in such problems as degraded reliability and failure of the Al interconnections due to the high aspect ratio of contact holes and poor step coverage of the sputtered Al; increased contact resistance caused by silicon (Si) precipitation; and, degradation of the shallow junction characteristics due to Al spiking.

In an effort to overcome these problems of the conventional Al metallization process, various new processes have been proposed. For example, for preventing degraded semiconductor reliability caused by failure of the Al interconnection due to the high aspect ratio of contact holes and poor step coverage of the sputtered Al in Al metallization, the following processes have been proposed.

Japanese Laid-Open Publication No. 62-132348 (by Yukiyosu Sugano et al.), discloses a method for improving the conformity of a film formed over an abrupt step of a semiconductor device, which method comprises forming a metal wiring layer on the abrupt step (provided on a semiconductor substrate) and then thermally melting the wiring layer in such a manner as to planarize the metal wiring layer. Japanese Laid-Open Publication No. 63-99546 (by Shinpei Lijima et al.), discloses a method to improve wiring reliability and to enable the formation of a multilayer interconnection, wherein a metallic wiring layer is formed on a substrate having contact holes and steps, by means of heating and fusing the metallic wiring layer. More particularly, Shinpei Lijima et al. teaches a method for manufacturing a semiconductor device, which comprises the steps of forming multiple devices on a semiconductor substrate, depositing an insulation layer on the multiple devices, forming in the insulation layer contact holes reaching a predesignated portion of the device, forming a titanium nitride film on the surface of the insulation layer and contact holes, depositing a metallic wiring layer on the whole surface of the titanium nitride film and then heating the metallic layer so that it is fused and made to flow to planarize the surface of the metallic layer, and etching the metallic layer and the titanium nitride film according to a predesignated wiring pattern to form at least the first wiring layer.

In Japanese Laid-Open Publication No. 62-109341 (by Masahiro Shimizu et al.), for improving the reliability of a semiconductor device against wiring disconnections, there is suggested a method which comprises forming an aluminum conductive film having good coverage at a step, such as at a contact hole of an insulating film surface.

More particularly, Masahiro Shimizu et al. disclose a method for manufacturing a semiconductor device which comprises coating on a silicon substrate a solution containing liquid-phase aluminum (or aluminum compound), and then solidifying the same to form an aluminum conductive film.

According to all of the above methods, the contact hole is filled by means of melting and reflowing Al or an Al alloy. To summarize, in the reflowing step, the metal layer of Al or Al alloy is heated beyond its melting temperature, and the thusly melted metal is flowed into the contact hole to fill the same. This reflowing step entails the following drawbacks and disadvantages. First of all, the semiconductor wafer must be disposed horizontally so as to allow proper filling of the contact hole with the flowing melted material. Secondly, the liquid metal layer flowed into the contact hole will seek a lower surface tension, and thus, may, upon solidifying, shrink or warp, and thereby expose the underlying semiconductor material. Further, the heat treatment temperature cannot be precisely controlled and therefore, it is difficult to reproduce a given result. Moreover, although these methods may fill a contact hole with the melted metal of the metal layer, the remaining areas of the metal layer (outside of the contact hole area) may become rough, thereby impairing subsequent protective coating processes. Therefore, a second metal coating process may be required to smooth or planarize these rough areas of the metal layer.

It is also presently known that, for improving the reliability of the semiconductor by preventing degradation of the shallow junction characteristics due to Al spiking, a barrier layer can be formed in the contact hole formed on the semiconductor wafer. For example, in U.S. Pat. No. 4,897,709 (by Natsuki Yokoyama et al.), there is described a semiconductor device which includes a titanium nitride film (barrier layer) which is formed in a hole for preventing a reaction between the metal wiring layer and the semiconductor substrate. The titanium nitride film can be formed by a low pressure CVD method implemented with a cold-type CVD apparatus. The resultant film has excellent characteristics with good step coverage for a considerably fine hole having a large aspect ratio. After forming the titanium nitride film, a wiring layer is formed by a sputtering method using Al alloy.

As an alternative to melting Al or Al alloy for filling contact holes, and in order to improve the metal step coverage, a multiple step metallization process is disclosed in U.S. Pat. No. 4,970,176 (Clarence J. Tracy et al.). According to the above patent, a first portion of a predetermined thickness of a metal layer is deposited on a semiconductor wafer at a cold temperature; and then, the temperature is increased to a temperature of approximately 400° C. to 500° C., which allows the metal layer to reflow; and then, the remaining portion of the metal layer is deposited, or, alternatively, after the first metal layer is deposited, a second metal layer can be deposited, while increasing the temperature to the high temperature which allows for reflow of the metal layer. The reflow of the metal layer takes place through grain growth, recrystallization and bulk diffusion.

Ono et al. have disclosed that when the semiconductor substrate temperature is above 500° C., the liquidity of Al-Si suddenly increases (Hisako Ono et al., in Proc., 1990 VMIC Conference June 11 and 12 pp. 76-82). According to the teaching of Ono et al., the stress of an Al-1%Si film changes abruptly near 500° C., and the stress relaxation of t he Al-1%Si film occurs rapidly at that temperature. Additionally, the temperature of the semiconductor substrate must be maintained between 500° C. and 550° C. in order to fill the contact holes satisfactorily. This mechanism is different from the mechanism which facilitates reflow of the metal layer in the Tracy et al. ('176) patent.

One of the present inventors has an invention now pending in the U.S.P.T.O. entitled "A Method for Forming a Metal Layer in a Semiconductor Device," and filed as U.S. patent application Ser. No. 07/585,218. This invention relates to a method for forming a metal wiring layer through a contact hole in a semiconductor device, which comprises the steps of depositing a metal at a low temperature (below 200° C.) and post-heating the deposited metal material at a temperature ranging from 80% of the melting point of the deposited metal material to its melting point temperature.

FIGS. 1A, 1B and 1C show a method for forming a metal layer according to the above invention. Referring to FIG. 1A, in which a process for forming a first metal layer is shown, a contact hole 2 is formed on the semiconductor substrate 10. Then, the substrate is put into a sputtering reaction chamber (not shown), in which a first metal layer 4 is formed by depositing the metal, (aluminum (Al) or Al alloy), at a temperature of 200° C. or less and under a predetermined level of vacuum. This layer 4 has a grainy texture.

FIG. 1B illustrates the method of filling the contact hole. Referring to FIG. 1B, after the substrate structure obtained by the preceding process is moved to another sputter reaction chamber (not shown), without breaking the vacuum, heating is carried out for at least 2 minutes at a temperature of 550° C., thereby filling up the contact hole with the metal. At this time, the pressure in the reaction chamber is preferably as low as possible so that the aluminum atoms have a higher surface free energy. In this manner, the metal can more easily fill the contact holes. The reference numeral 4a designates the metal filling the contact hole 2.

The heat treatment temperature range in the process shown in FIG. IB is essentially between 80% of the melting point of the metal and the melting point of the metal, and will vary according to the particular aluminum alloy or aluminum employed.

Since the metal layer is heat-treated at a temperature lower than aluminum's melting point of 660° C., the metal layer does not melt. For example, at 550° C., the Al atoms deposited by sputtering at a temperature below 150° C. migrate upon heat-treatment at a higher temperature, instead of melting. This migration increases when the surface area is uneven or grainy due to an increase in energy among the surface atoms which are not in full contact with surrounding atoms. Thus, the initially sputtered, grainy layer exhibits increased atomic migration upon heat-treatment.

A process for forming a second layer 5 is shown in FIG. 1C. More particularly, second metal layer 5 is formed by depositing the remainder of the required total metal layer thickness at a temperature selected on the basis of the desired reliability of the semiconductor device. This completes the formation of the total (composite) metal layer.

According to the above method, the contact hole can be easily and fully filled up with a metal by using the same sputtering equipment used for the conventional thermal deposition method, and then annealing the deposited metal. Therefore, even a contact hole with a high aspect ratio can be completely filled.

However, when a void is formed in the contact hole or when the step coverage of the metal layer is inadequate, the contact hole cannot be filled up while maintaining the semiconductor wafer deposited with the metal layer at a predetermined temperature and vacuum level. Further, although a secondary metal layer is subsequently formed on the semiconductor wafer having a previously deposited primary metal layer, good step coverage of the contact hole cannot be assured, and the reliability of the manufactured semiconductor device is degraded due to this inadequate step coverage.

A contact structure consisting of pure Al deposited directly onto Si was adopted in the earliest stages of silicon technology. However, the Al-to-Si contact exhibits some poor contact characteristics such as junction spiking during sintering. The sintering step is performed after the contact metal film has been deposited and patterned. In the case of Al-Si contacts, such sintering causes the Al to react with the native-oxide layer that forms on the silicon surface. As the Al reacts with the thin SiO2 layer, Al2O3 is formed, and in a good ohmic contact, the native oxide is eventually completely consumed. Thereafter, Al diffuses through the resultant Al2O3 layer to reach the Si surface, forming an intimate metal-Si contact. Al must diffuse through the Al2O3 layer to reach the remaining SiO2. As the Al2O3 layer increases in thickness, it takes longer for Al to penetrate it. Thus, if the native-oxide layer is too thick, the Al2O3 layer eventually also becomes too thick for Al to diffuse through it. In this case, not all of the SiO2 will be consumed, and a poor ohmic contact will result. The penetration rate of Al through Al2O3 is a function of temperature. For acceptable sinter temperature and sinter times, the thickness of the Al2O3 should be in the range of 5-10Å. Since the maximum Al2O3 thickness is of the order of the thickness of the native oxide that is consumed, an approximate upper limit to the allowable thickness of the native-oxide layer is fixed. The longer the silicon surface is exposed to an oxygen-containing ambient atmosphere, the thicker the native oxide will be. Therefore, surface-cleaning procedures in most contact processes are performed just prior to loading the wafers into the deposition chamber for metal deposition.

Aluminum absorbs from 0.5 to 1% silicon at a contact-alloying temperature between 450° C. and 500° C. If a pure Al film were heated to 450° C. and a source of silicon were provided, then the Al would absorb silicon in solution until a Si concentration of 0.5 wt. % is reached. The semiconductor substrate serves as such a source of silicon, as silicon from the substrate enters the Al by diffusion, at elevated temperatures. If a large volume of Al is available, a significant quantity of the Si from below the Al-Si interface can diffuse into the Al film. Simultaneously, the Al from the film moves rapidly to fill the voids created by the departing Si. If the penetration of the Al is deeper than the pn-junction depth below the contact, the junction will exhibit large leakage currents or even become electrically shorted. This phenomenon is referred to as junction spiking.

For alleviating the problem of junction spiking at the contacts, Si is added to the Al film as it is deposited. Aluminum-silicon alloys (1.0 wt. % Si) have been widely adopted for manufacturing the contacts and interconnects of integrated circuits. The use of aluminum-silicon alloys instead of pure Al may alleviate the problem of junction spiking, but unfortunately, it causes another problem. More particularly, during the cooling cycle of the annealing process, the solubility of silicon in the Al decreases with decreasing temperature. The aluminum thus becomes supersaturated with Si, which cause nucleation and outgrowth of Si precipitates from the Al-Si solution. Such precipitation occurs both at the Al-SiO2 interface and the Al-Si interface in the contacts. If these precipitates form at the contact interface to create n+Si, an undersireable increase in contact resistance results. In addition, a large flux-divergence in the current is produced at locations where n+Si precipitates larger than approximately 1.5μ are formed. This can lead to early failure of the conductor due to an electromigration-induced open circuit condition.

FIG. 2. illustrates Si precipitates formed on the surface of the semiconductor substrate after metallization. Obviously, these Si precipitates should be removed. These Si precipitates have hitherto been removed by ashing, overetching or wet etching, or by using an etchant including a radical which may remove the precipitates from the substrate. However, when depositing the metal layer at a high temperature, the Si precipitates cannot be easily removed. When the Si precipitates are removed by overetching, the images thereof are transmitted to an underlying layer, and these images remain after the overetching. Thus, the quality and appearance of the surface of the semiconductor substrate remains poor.

Based upon the above and foregoing, it can be appreciated that there presently exists a need for a method for forming a planar metal wiring layer in a semiconductor device, which overcomes the above-described shortcomings and disadvantages of the presently available processes. The present invention addresses and fulfills this need.

SUMMARY OF THE INVENTION

Accordingly, it is an object of the present invention to provide an improved method of forming a metal wiring layer in a semiconductor device having contact holes formed on the semiconductor substrate thereof, comprising the steps of depositing a metal, and then completely filling the contact holes, to thereby obtain a reliable metal wiring layer.

Another object of the present invention is to provide an improved method of forming a metal layer for a metal wiring pattern, which does not produce any Si precipitates in subsequent processes.

In accordance with the present invention, there is provided a method for manufacturing a semiconductor device which comprises the steps of forming an insulating interlayer on a semiconductor substrate, providing the insulating interlayer with an opening formed on the semiconductor substrate, forming a first metal layer on the semiconductor wafer, heat-treating the first metal layer to fill up the opening with said metal, forming a second metal layer on the first metal layer and then heat-treating the second metal layer to planarize the second metal layer.

The first metal layer is formed by depositing a metal such Al or Al alloy in a vacuum, at example, Al0.5-%Cu, Al-1%Si, Al-1%Si-0.5%Cu, etc. The first metal layer is deposited preferably at a temperature below 150° C. The lower the temperature is, the more easily the metal atoms migrate into the opening upon subsequent heat-treatment. The thickness of the first metal layer is preferably one-third to two-thirds of the predetermined thickness of the total (composite) metal layer (i.e. the combined thickness of the first and second metal layers).

After forming the first metal layer in a vacuum, the metal layer is heat-treated, without breaking the vacuum. The heat treatment is carried out by heating the semiconductor substrate in an inert atmosphere of 10 m Torr or less or in a vacuum of $5 \times 10^{-7}$ torr or less, at a temperature ranging from 0.8 Tm to Tm, preferably from 500° C. to 550° C., where Tm is the melting temperature of the metal using a gas conduction method or an RTA (Rapid Thermal Annealing) method. The heat-treatment can be carried out in an inert gas (e.g., N2, Ar) atmosphere or a reductive gas (e.g. H2) atmosphere. When the metal layer is heat-treated, the metal atoms migrate into the opening, in order to reduce the surface free energy thereof. As a result, the opening is filled up with the metal. As the metal atoms migrate into the opening, the surface area of the metal layer decreases. Therefore, an overhanging portion of the metal layer disappears from the upper portion of the opening, and the inlet area of the opening becomes larger. Thus, when depositing a second metal layer thereafter, good step coverage of the metal layer can be obtained.

If the vacuum is broken during the above heat-treatment step, oxidation causes formation of a Al2O3 film, which prevents the Al atoms from migrating into the opening at the above temperature. Therefore, the opening cannot be completely filled up with the metal, which is obviously undesirable. The above heat-treatment step is carried out preferably for 1–5 minutes when using an Argon gas conduction method, and when using the RTA apparatus, the metal layer is preferably heat-treated for several cycles of about 20–30 seconds, or continuously for about 2 minutes.

Thereafter, a second metal layer is formed by depositing a metal in the same manner as described above in connection with the forming of the first metal layer, except that the metal deposition is carried out at a temperature below 350° C. After forming the second metal layer, the second metal layer is also heat-treated in the same manner as described above in connection with the heat-treating of the first metal layer.

All the above steps are carried out in an inert atmosphere of 10 m Torr or less or in a vacuum of $5 \times 10^{-7}$ torr or less, and without breaking the vacuum, which is one of the most important features of this invention.

According to one embodiment of this invention, after forming an opening on the semiconductor substrate, a diffusion barrier layer is formed on the whole surface of the semiconductor wafer including the opening. The barrier layer is comprised of a transition metal or transition metal compound such as titanium or titanium nitride.

When wiring made of aluminum or aluminum alloy film is connected with the surface of a thin region doped with impurities through a contact hole and heat treatment is effected, aluminum is diffused into the impurity-doped region and pierces the pn-junction, which causes junction spiking and possible destruction of the pn-junction.

For preventing a reaction between the aluminum and the semiconductor substrate, a method comprising interposing a barrier layer made of titanium nitride between the wiring layer made of Al or Al alloy and the surface of the semiconductor substrate has been proposed. For example, the formation of a titanium nitride film by a reactive sputtering method is disclosed in J. Vac. Sci. Technol., A4(4), 1986, pp. 1850-1854. Also, U.S. Pat. No. 4,897,709, discloses the use of a titanium nitride film having a uniform thickness and excellent properties as a barrier layer, provided on the inner surface of an extremely fine hole having a large aspect ratio.

Additionally, Yoda Dakashi et al. have suggested a method for manufacturing a semiconductor device which comprises the steps of forming double barrier layers for preventing a reaction between the wiring layer and the semiconductor substrate or an insulation layer provided on the inner surface of the contact holes, and then filling said contact holes with a deposited metal such as an Al alloy while heating the semiconductor substrate to a desired temperature (Korean Laid-Open Patent Publication No. 90-15277 corresponding to Japanese Patent Application No. 01-061557 filed On Mar. 14, 1989).

Returning now to the present invention, the diffusion barrier layer can be easily formed on the inner surface of the contact opening in the present invention by utilizing any of the above-described techniques. The barrier layer is preferably comprised of a first barrier layer such as a Ti metal layer and a second barrier layer such as a titanium nitride layer. The thickness of the first barrier layer is preferably between 100-300Å, and the thickness of the second barrier layer is preferably between 200-1500Å.

According to another aspect of the present invention, an anti-reflective layer is formed on the second metal layer for preventing unwanted reflections in subsequent photolithographic steps, thereby improving the reliability of the metal wiring. Further, according to the present invention, there is provided a method for manufacturing a semiconductor device, which comprises the steps of providing a semiconductor wafer, with an opening formed thereon, forming a metal layer on the semiconductor wafer and then heat-treating the metal layer to fill up the opening with said metal, wherein a pure aluminum or aluminum alloy with no Si component is used as the metal in forming the metal layer. The opening of the present invention is preferably a contact hole having a step at the upper portion thereof.

Suitable metals which may be employed in the practice of this invention include, for example, pure Al, Al-Cu and Al-Ti. According to a preferred embodiment of the present invention, the metal layer is formed by a method which comprises the steps of forming a first metal layer by depositing a first metal layer, heat-treating the first metal layer, and then depositing a second metal layer over the first metal layer. Either the first metal layer or the second metal layer is pure Al or Al alloy with a Si component, and the other is aluminum alloy with a Si component. The metal layers can be deposited by a conventional sputtering method at a predetermined temperature. The metal layers also can be formed by successively depositing a metal with no Si component and a metal with a Si component, with each deposition being carried out at least once. The metal with no Si component absorbs Si atoms from the metal with a Si component when the temperature is lowered. Therefore, formation of Si precipitates on the surface of the semiconductor substrate is eliminated. Additionally, the metal with no Si component absorbs the Si atoms from the metal with a Si component more easily than from the semiconductor substrate. Therefore, Al spiking is also advantageously eliminated.

According to another aspect of this invention, after forming an opening, a barrier layer is formed on the entire surface of the resultant semiconductor wafer in order to prevent a reaction between the metal layer and the semiconductor substrate or the insulating layer. The barrier layer is composed of a metal compound with a high melting point, such as TiN. The opening can be a contact hole having a step at the upper portion thereof, with an aspect ratio of 1.0 or more.

The metal layer is preferably formed in a vacuum sputtering chamber at a temperature below 150° C. The metal layer is heat-treated at a temperature between 0.8 Tm and Tm. All of the above steps for forming a metal wiring layer are preferably carried out in a vacuum and without breaking the vacuum.

BRIEF DESCRIPTION OF THE DRAWINGS

The foregoing objects of the present invention will be better understood from the following detailed description of the invention with reference to the accompanying drawings, of which.

DESCRIPTION OF THE PREFERRED EMBODIMENTS

Embodiment 1

FIGS. 3A to 3D illustrate one embodiment of a method for forming a metal wiring structure according to the present invention.

Figure 1A:
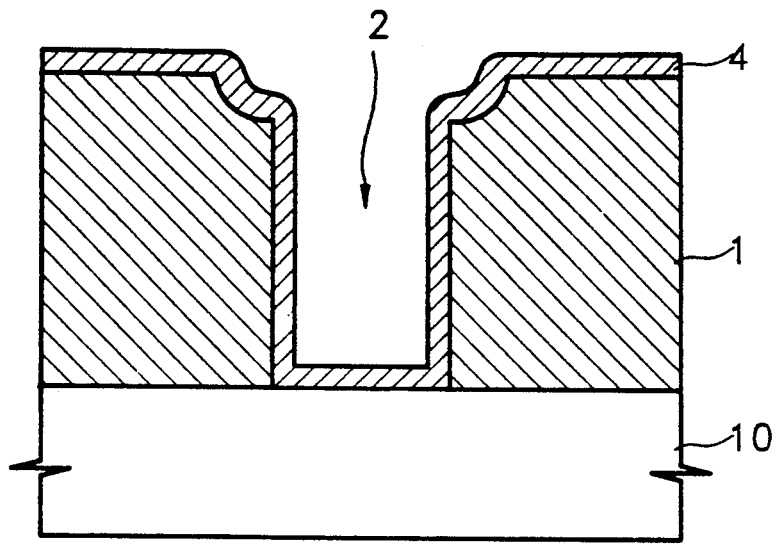
FIGS. 1A, 1B, and 1C illustrate a method for forming a metal layer on the surface of a semiconductor structure, in accordance with the invention disclosed in U.S. patent application Ser. No. 07/585,218, abandoned.
Figure 1B:
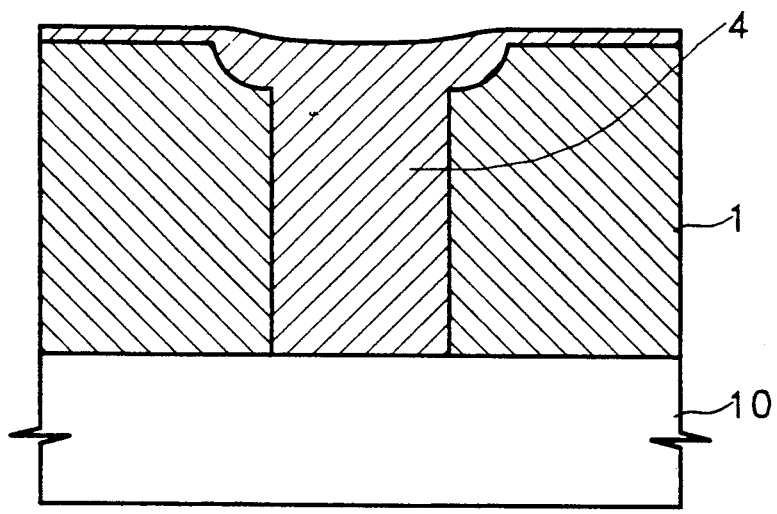
Figure 1C:
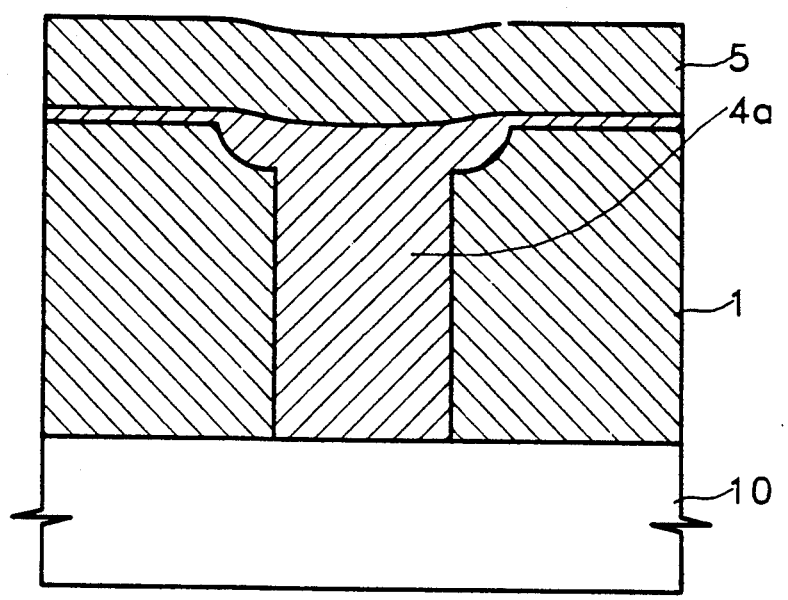
Figure 2:
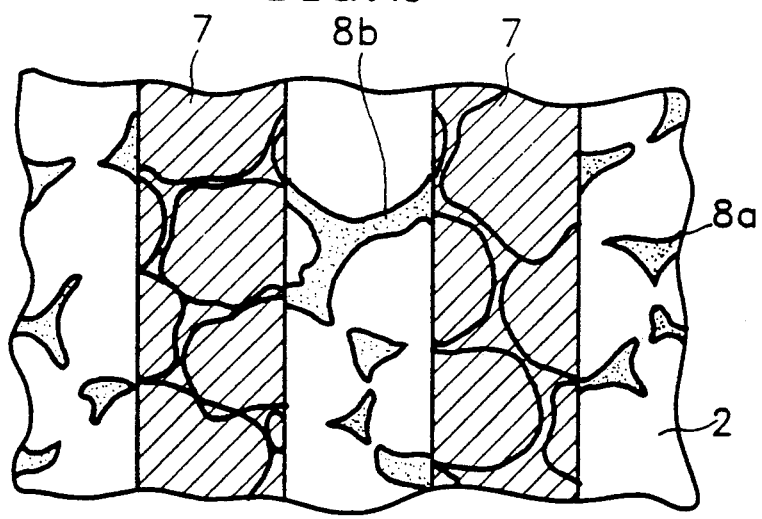
FIG. 2 illustrates Si precipitates formed on the surface of the semiconductor substrate, after metallization, in accordance with the method depicted in FIG. 1.
Figure 3A:
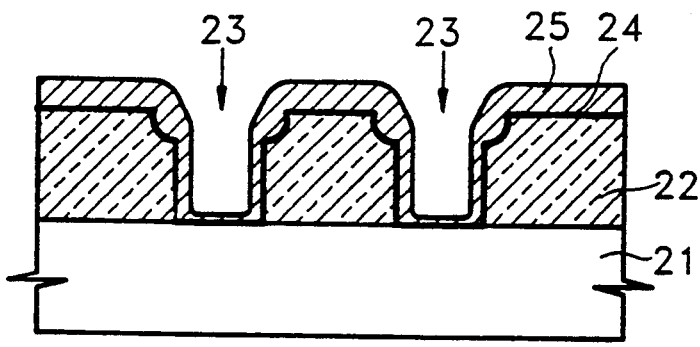
FIGS. 3A to 3D illustrate one embodiment of a method for forming a metal wiring layer according to the present invention.

FIGS. 3A illustrates a step of forming a first metal layer. More particularly, an opening (23) having a 0.8 μm diameter and having a stepped portion thereon is formed on a semiconductor substrate (21) provided with an insulating interlayer (22), and then the substrate (21) is cleaned.

Next, a barrier layer (24) consisting of a high-melting temperature metal compound such as TiN is deposited over the entire surface of the insulating interlayer (22) and exposed portions of the semiconductor substrate (21). The thickness of the barrier layer (24) is preferably between 200–1500Å. The substrate (21) is then put into a sputtering reaction chamber (not shown), wherein a first metal layer (25) is formed by depositing a metal, e.g. aluminum or aluminum alloy with no Si component, to a thickness of two-thirds of the desired thickness of the total (composite) metal layer (4000Å when desired thickness of the total metal layer is 6000Å), at a temperature of about 150° C., under a predetermined level of vacuum. The first metal layer (25) thus formed has a small aluminum grain and a high surface free energy.

Figure 3B:
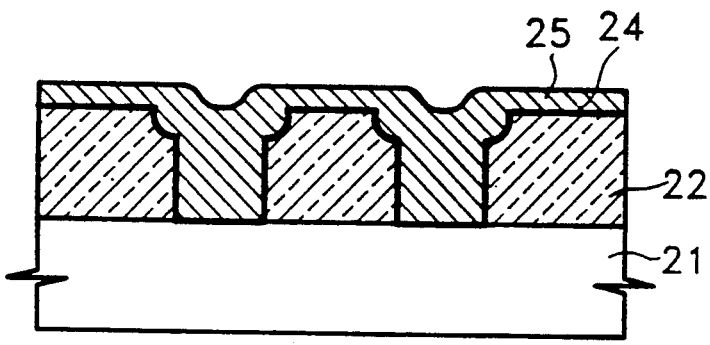

FIG. 3B illustrates a step of filling the openings 23. More particularly, the semiconductor wafer is moved into another sputtering reaction chamber (not shown) without breaking the vacuum, wherein the first metal layer (25) is heat-treated, preferably at a temperature of 550° C. for 3 minutes, thereby causing the grains of aluminum to migrate into the opening (23). The migration of the grains of aluminum causes its surface free energy to be reduced, thereby decreasing its surface area and facilitating complete filling of the openings with the aluminum, as shown in FIG. 3B.

Figure 3C:
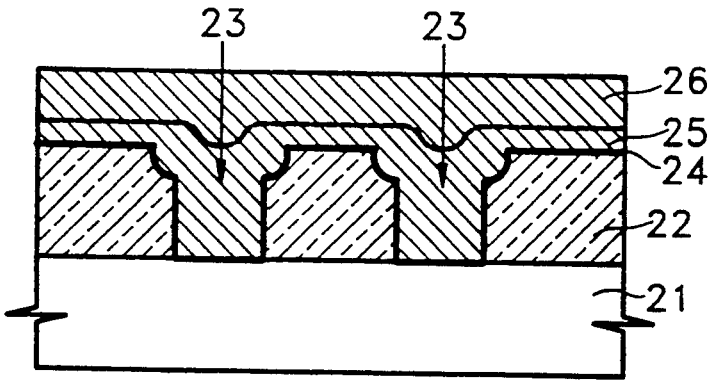

FIG. 3C illustrates a step of forming a second metal layer (26) on the first metal layer (25). More particularly, the second metal layer (26) is formed by depositing the remainder of the required total thickness of the total metal layer at a temperature below 350° C., thereby completing the formation of the total metal layer. The second metal layer (26) is formed by using an aluminum alloy having a Si component, such as Al-Si or Al-Cu-Si.

Figure 3D:
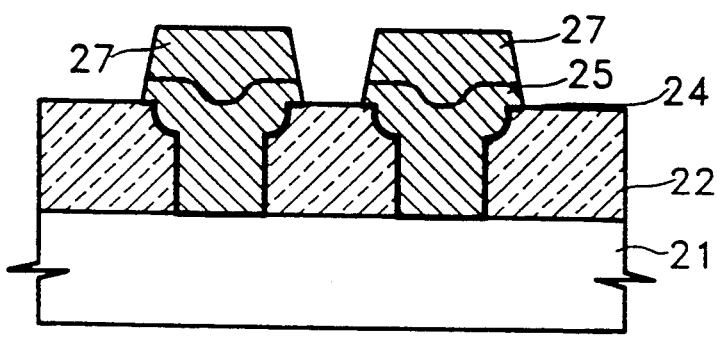

FIG. 3D illustrates a metal wiring pattern (27) obtained by removing predetermined portions of the second metal layer (26), the first metal layer (25) and the barrier layer (24), by a conventional lithography process, such as is well-known in the semiconductor process art.

Embodiment 2

FIGS. 4A to 4D illustrate another embodiment of a method for forming a metal wiring pattern according to the present invention.

Figure 4A:
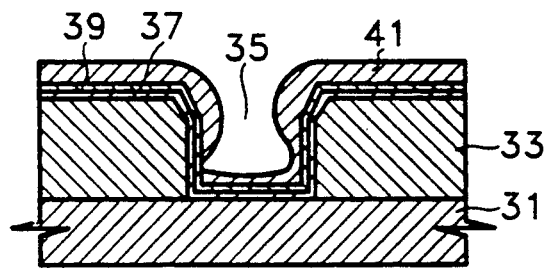
FIGS. 4A to 4D illustrate another embodiment of a method for forming a metal wiring layer according to the present invention; and, FIG. 5 illustrates the resultant clean surface of the semiconductor substrate obtained in accordance with a method of the present invention.

FIG. 4A illustrates a step of forming a first metal layer (41). More particularly, an opening (35) having a diameter of 0.8 μm and having a step at the upper portion thereof, is formed on a semiconductor substrate (31) provided with an insulating layer (33) composed of SiO2, and the substrate (31) is then cleaned. Thereafter, for preventing a reaction between the wiring layer and the semiconductor substrate (31) or an insulating layer (33), a first diffusion barrier layer (37) consisting of Ti is formed (preferably to a thickness of between 100–500Å) over the entire surface of the insulating layer (33) and exposed portions of the semiconductor substrate (31), including the opening (31), and a second diffusion barrier layer (39) consisting of TiN is formed (preferably to a thickness of between 200–1500Å) on the first diffusion barrier layer (37).

Next, the entire semiconductor wafer is heat-treated at a temperature of about 450° C. for half an hour under a N2 atmosphere. Then, a first metal layer (41) is deposited on the second diffusion layer (39), preferably to a thickness of between 2000–4000Å, using, for example, Al-0.5%Cu, Al-1% Si, or Al-0.5% Cu-1% Si alloy, heated to a temperature of 150° C. or less, and employing either a sputtering method, or a vacuum vapor deposition method.

Figure 4B:
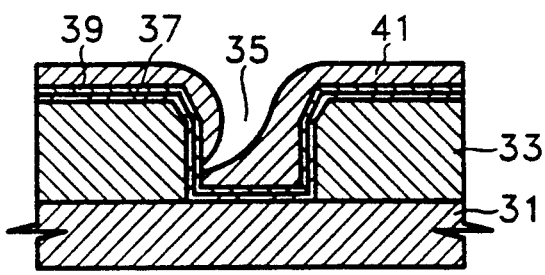

FIG. 4B illustrates a first step of heat-treating the metal layer (41). More particularly, the metal layer (41) is heat-treated at a temperature of 0.8 Tm - Tm for 1–5 minutes, in an inert atmosphere of $10^{-2}$ Torr or less or in a vacuum of $5 \times 10^{-7}$ Torr or less, without breaking the vacuum, using a gas conduction method.

Figure 4C:
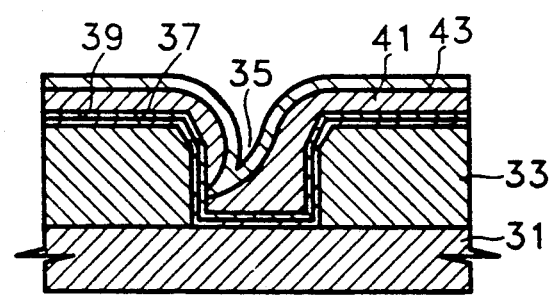

FIG. 4C illustrates a step of forming a second metal layer (43), preferably to a thickness of between 2000–4000Å, over the entire surface of the first metal layer (41), at a temperature below 350° C., without breaking the vacuum.

Figure 4D:
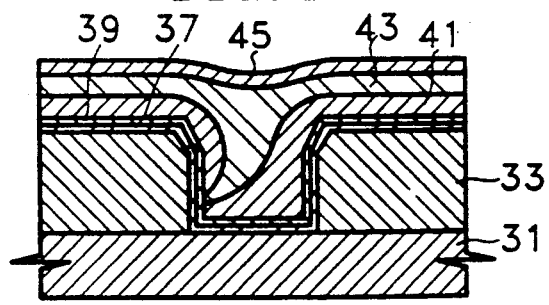

FIG. 4D illustrates a second step of a heat-treating the second metal layer (43), to thereby planarize the surface of the metal layer. This step is carried out in the same manner as is the first heat-treating step, without breaking the vacuum. Thereafter, an anti-reflective layer (45) composed of a transition metal compound such as TiN is formed, preferably to a thickness of between 200–500Å, on the surface of the second metal layer (43). Then, a metal wiring pattern (not shown) can be obtained according to a conventional lithography process.

In accordance with the principles of the present invention, the metal atoms of the metal layer formed on the semiconductor wafer migrate into the openings upon heat-treatment of the metal layer. When the metal layer is deposited at a lower temperature, the metal atoms migrate more easily into the opening upon subsequent heat-treatment. Additionally, after heat-treating the first-deposited metal layer, a second metal layer is deposited at a low temperature, and subsequently heat-treated. In this manner, a planarized metal layer can be obtained, and thus, subsequent lithographic steps can be more easily and effectively carried out. Also, in accordance with the present invention, by appropriately treating the second-deposited metal layer, an opening advantageously completely filled with metal can be realized.

Figure 5:
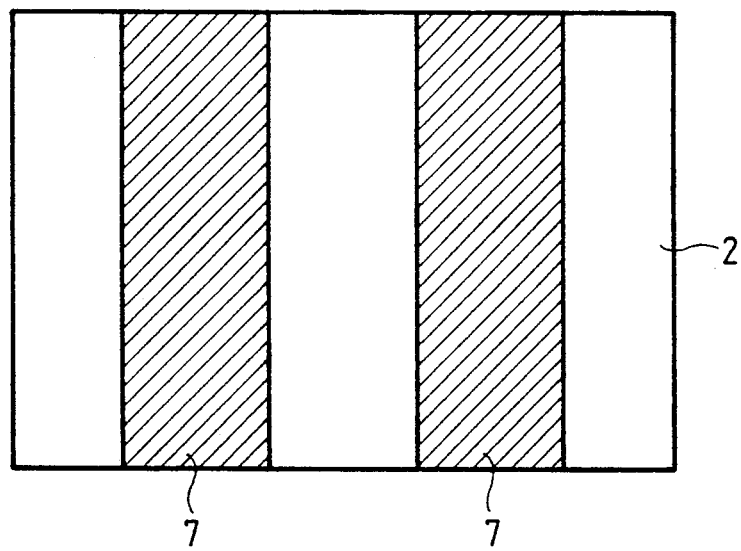

Further, according to the present invention, a metal with a Si component and a metal with no Si component are successively or simultaneously deposited to form a composite metal layer. A metal layer with no Si component absorbs Si atoms from the metal with the Si component, when the temperature of the semiconductor substrate is lowered. Therefore, Si precipitates are not formed on the surface of the semiconductor device after forming the wiring pattern, and Al spiking is completely eliminated. As can be seen in FIG. 5, a clean semiconductor substrate surface is realized. Therefore, a reliable metal wiring pattern can be obtained.

While the invention has been described with reference to particular embodiments, those skilled in the art will be able to make various modifications without departing from the true spirit and scope of the present invention as defined by the appended claims.

What is claimed is:

1. A method for manufacturing a semiconductor device, comprising the steps of:
   forming an insulating interlayer on a semiconductor substrate;
   providing said insulating layer with an opening;
   forming a first metal layer over said insulating interlayer;
   heat-treating said first metal layer, in a first heat-treating step, for an appropriate time, and at a temperature of between 0.8 Tm to Tm, where Tm is the melting temperature of the metal of said first metal layer, to thereby fill up said opening with said metal of said first metal layer;
   forming a second metal layer on said first metal layer to thereby providing a composite metal layer; and,
   heat-treating said second metal layer, in a second heat-treating step, for an appropriate time, and at a temperature sufficient to planarize the resultant surface of said second metal layer, without varying said temperature.

2. A method as claimed in claim 1, wherein:
   said opening extends to a surface of said semiconductor substrate, thereby exposing a portion of the surface of said semiconductor substrate; and
   said first metal layer forming step comprises forming said first metal layer over said insulating interlayer and said exposed surface portion of said semiconductor substrate.

3. A method as claimed in claim 2, further comprising the step of forming a diffusion barrier layer on the surfaces of said insulating interlayer and said semiconductor substrate which define said opening.

4. A method as claimed in claim 3, wherein said diffusion barrier layer is comprised of a metal selected from the group consisting of transition metals and transition metal compounds.

5. A method as claimed in claim 3, wherein said diffusion barrier layer is comprised of a material selected from the group consisting of titanium and titanium nitride.

6. A method as claimed in claim 3, wherein said diffusion barrier layer forming step comprises the steps of:
   forming a first diffusion barrier layer on the surfaces of said insulating interlayer and said semiconductor substrate which define said opening; and,
   forming a second diffusion barrier layer over said first diffusion barrier layer.

7. A method as claimed in claim 6, wherein said first barrier layer is comprised of Ti and said second barrier layer is comprised of titanium nitride.

8. A method as claimed in claim 6, wherein said first barrier layer has a thickness of 100–500Å and said second barrier layer has a thickness of 200–1500Å.

9. A method as claimed in claim 2, wherein said first metal layer forming step comprises depositing a metal, in a vacuum and at a low temperature, on said insulating interlayer and said exposed surface portion of said semiconductor substrate.

10. A method as claimed in claim 9, wherein said low temperature is below 150° C.

11. A method as claimed in claim 9, wherein said first metal layer heat-treating step is carried out without breaking said vacuum.

12. A method as claimed in claim 2, further comprising the step of forming an anti-reflective layer on said second metal layer.

13. A method as claimed in claim 12, wherein said anti-reflective layer is comprised of a transition metal compound.

14. A method as claimed in claim 13, wherein said transition metal compound is titanium nitride.

15. A method as claimed in claim 2, wherein said first and second layers are comprised of a metal selected from the group consisting of Al and Al alloys.

16. A method as claimed in claim 1, wherein said first metal layer heat-treating step is carried out at a temperature ranging from 0.8 Tm to Tm, where Tm is the melting temperature of the metal.

17. A method as claimed in claim 1, wherein said first metal layer has a thickness of one-third to two-thirds of a predetermined thickness of said composite layer.

18. A method as claimed in claim 1, wherein said second metal layer forming step comprises depositing a metal on said first metal layer at a temperature below 350° C.

19. A method as claimed in claim 1, wherein said second metal layer has a thickness of one-third to two-thirds of a predetermined thickness of said composite metal layer.

20. A method as claimed in claim 1, wherein said second metal layer heat-treating step is carried out at a temperature ranging from 0.8 Tm to Tm, where Tm is the melting temperature of the metal.

21. A method as claimed in claim 1, wherein all steps are carried out in a vacuum and without breaking the vacuum.

22. A method as claimed in claim 1, wherein all steps are carried out in an inert atmosphere.

23. A method as claimed in claim 22, wherein all the steps are carried out in an inert atmosphere of 10 m Torr or less.

24. A method as claimed in claim 1, wherein all steps are carried out in a reduction gas atmosphere.

25. A method as claimed in claim 1, wherein said opening is a contact hole having a step at an upper portion thereof.

26. A method as claimed in claim 1, wherein said first metal layer is comprised of a metal selected from the group consisting of Al and Al-alloys having no Si component, and said second metal layer is comprised of a metal selected from the group consisting of Al and Al-alloys having a Si component.

27. A method as claimed in claim 1, wherein said first metal layer is comprised of a metal selected from the group consisting of Al and Al-alloys having a Si component, and said second metal layer is comprised of a metal selected from the group consisting of Al and Al-alloys having no Si component.

28. A method for manufacturing a semiconductor device, comprising the steps of:
   providing a semiconductor wafer with an opening formed therein;
   forming a first metal layer on the semiconductor wafer;
   heat-treating said first metal layer, in a first heat-treating step, for an appropriate time, and at a temperature of between 0.8 Tm to Tm, where Tm is the melting temperature of the metal of said first metal layer, to thereby fill up said opening with metal of said first metal layer;
   forming a second metal layer on said first metal layer to thereby provide a composite metal layer;
   heat-treating said second metal layer, in a second heat-treating step, for an appropriate time and at a temperature sufficient to planarize the resultant surface of said second metal layer, without varying said temperature; and, wherein said metal of said first metal layer is comprised of a metal selected from the group consisting of pure Al and aluminum alloys having no Si component, and wherein the metal of said second metal layer is comprised of an aluminum alloy having a Si component.

29. A method as claimed in claim 28, further comprising the step of forming a barrier layer on the entire surface of said semiconductor wafer, including portions of said surface which define said opening.

30. A method as claimed in claim 29, wherein said barrier layer is comprised of a high melting temperature metal compound.

31. A method as claimed in claim 30, wherein said metal compound is titanium nitride.

32. A method as claimed in claim 28, wherein said aluminum alloys having no Si component are Al-Cu alloys and Al-Ti alloys.

33. A method as claimed in claim 28, wherein said opening comprises a contact hole having a stepped portion formed thereon.

34. A method as claimed in claim 28, wherein said first metal layer forming step is carried out by depositing a metal on said semiconductor wafer, in a vacuum, using a sputtering process.

35. A method as claimed in claim 34, wherein said first metal layer forming step is carried out at a temperature of 150° C. or less.

36. A method as claimed in claim 28, wherein said opening has an aspect ratio greater than 1.0.

37. A method as claimed in claim 28, wherein said first heat-treating step is carried out in a sputtering chamber, under vacuum, without breaking said vacuum.

38. A method for forming a planarized composite metal layer in a semiconductor device which includes a semiconductor substrate and an insulating layer formed on the substrate, the insulating layer having an opening formed therein, the method comprising the steps of:

forming a first metal layer on said insulating layer, at a first low temperature;

heating said first metal layer to a first higher temperature sufficient to cause said opening to become filled with metal of said first metal layer;

forming a second metal layer on said first metal layer, at a second low temperature, to thereby providing a composite metal layer comprised of said first metal layer and said second metal layer; and, heating said second metal layer to a second higher temperature sufficient to planarize said composite metal layer.

39. The method as set forth in claim 38, wherein said first low temperature is less than approximately 150 degrees C.

40. The method as set forth in claim 39, wherein said second low temperature is less than approximately 350 degrees C, but greater than said first low temperature.

41. The method as set forth in claim 40, wherein said first higher temperature is between 0.8 Tm and Tm, where Tm is the melting temperature of the metal of said first metal layer.

42. The method as set forth in claim 41, wherein said second higher temperature is between 0.8 Tm and Tm.

43. The method as set forth in claim 42, wherein all of said steps are carried out in a vacuum, without breaking said vacuum.

44. The method as set forth in claim 43, wherein the pressure of said vacuum is not greater than approximately $5 \times 10^{-7}$ torr.

45. The method as set forth in claim 43, further comprising the step of forming a diffusion barrier layer on the surfaces of said insulating layer and said semiconductor substrate which define said opening, prior to performing said forming a first metal layer step, whereby said forming said first metal layer step is then carried out by forming said first metal layer on said insulating layer and said diffusion barrier layer.

46. The method as set forth in claim 45, wherein said diffusion barrier layer forming step comprises the substeps of:

forming a first diffusion barrier layer on said surfaces of said insulating layer and said semiconductor substrate which define said opening; and, forming a second diffusion barrier layer on said first diffusion barrier layer.

47. The method as set forth in claim 46, wherein said first diffusion barrier layer is comprised of Ti and said second diffusion barrier layer is comprised of titanium nitride.

48. The method as set forth in claim 43, wherein said first metal layer is formed to a thickness of between one-third to two-thirds of the overall thickness of said composite metal layer.

49. The method as set forth in claim 43, wherein said first metal layer is comprised of a metal selected from the group consisting of Al and Al-alloys having no Si component, and said second metal layer is selected from the group consisting of Al and Al-alloys having a Si component.

50. The method as set forth in claim 43, further comprising the step of forming an anti-reflective layer on said second metal layer, following said last heating step.

51. The method as set forth in claim 50, wherein said anti-reflective layer is comprised of a transition metal compound.

52. The method as set forth in claim 43, wherein said opening comprises a contact hole having an aspect ratio greater than 1.

53. The method as set forth in claim 42, wherein all of said steps are carried out in an inert atmosphere at a pressure not greater than approximately $10^{-2}$ torr.

54. The method as set forth in claim 42, wherein all of said steps are carried out in a reductive gas atmosphere at a pressure not greater than approximately $10^{-2}$ torr.

* * * * *